(12) United States Patent
Dighde et al.

(10) Patent No.: US 9,507,383 B2
(45) Date of Patent: Nov. 29, 2016

(54) COMPUTING DEVICE BONDING ASSEMBLIES

(71) Applicant: Microsoft Corporation, Redmond, WA (US)

(72) Inventors: Rajesh Dighde, Redmond, WA (US); Tim M. Sullivan, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 39 days.

(21) Appl. No.: 14/503,225

(22) Filed: Sep. 30, 2014

(65) Prior Publication Data

US 2016/0091932 A1     Mar. 31, 2016

(51) Int. Cl.
| | | |
|---|---|---|
| *G06F 1/16* | (2006.01) | |
| *B29C 65/48* | (2006.01) | |
| *B29C 65/02* | (2006.01) | |
| *H05K 5/06* | (2006.01) | |

(52) U.S. Cl.
CPC ............ *G06F 1/1656* (2013.01); *B29C 65/02* (2013.01); *B29C 65/48* (2013.01); *G06F 1/1626* (2013.01); *G06F 1/1637* (2013.01); *G06F 1/1658* (2013.01); *H05K 5/062* (2013.01)

(58) Field of Classification Search
CPC ....................................................... G06F 1/16
See application file for complete search history.

(56) References Cited

U.S. PATENT DOCUMENTS

| | | | |
|---|---|---|---|
| 6,958,748 B1 | 10/2005 | Fukui et al. | |
| 7,066,376 B2 | 6/2006 | Scher et al. | |
| 8,964,298 B2* | 2/2015 | Haddick | G06F 3/013 359/630 |
| 2007/0248892 A1* | 10/2007 | Rangelow | G03F 9/7038 430/5 |
| 2008/0266766 A1 | 10/2008 | D'Urso et al. | |
| 2009/0091045 A1* | 4/2009 | Tanikawa | C08G 59/306 257/791 |
| 2009/0102882 A1* | 4/2009 | Silverbrook | B41J 2/04541 347/20 |
| 2009/0220923 A1 | 9/2009 | Smith et al. | |
| 2011/0219635 A1* | 9/2011 | Rangelow | G03F 9/7038 33/645 |
| 2014/0085414 A1 | 3/2014 | Zhou et al. | |
| 2014/0287299 A1* | 9/2014 | Krogdahl | H05K 1/02 429/185 |

FOREIGN PATENT DOCUMENTS

| | | |
|---|---|---|
| DE | 10245564 A1 | 4/2004 |
| WO | 2012149225 A2 | 11/2012 |
| WO | 2016/053821 A1 | 4/2016 |

OTHER PUBLICATIONS

Lee, et al., Novel Flat Screen Refreshable Braille Display Technology for the Blind and Partially Sighted:, Retrieved on: Jul. 7, 2014; Available at: http://www3.imperial.ac.uk/pls/portallive/docs/1/31449705.PDF.
Yarimaga, et al., "A Thermally Actuated Organic Display Device Using Thermo-Chromatic Polymer Composite Film with Self-Aligned Patterns", : In IEEE 21st International Conference on Micro Electro Mechanical Systems, Jan. 1, 2008, pp. 750-753.
International Search Report and Written Opinion mailed Dec. 8, 2015 from PCT Patent Application No. PCT/US2015/052541, 11 pages.
International Search Report & Written Opinion mailed Dec. 8, 2015 from PCT Patent Application No. PCT/US2015/052541, 11 pages.
Amendment under Article 34 filed Mar. 16, 2016 to the International Search Report and Written Opinion mailed Dec. 8, 2015 from PCT Patent Application PCT/US2015/052541, 7 pages.
Second Written Opinion mailed Aug. 8, 2016 from PCT Patent Application No. PCT/US2015/052541, 6 pages.
Response filed Sep. 22, 2016 to the Second Written Opinion mailed Aug. 8, 2016 from PCT Patent Application No. PCT/US2015/052541, 6 pages.
Preliminary Amendment filed Oct. 18, 2016 to U.S. Appl. No. 15/288,462, 6 pages.

* cited by examiner

*Primary Examiner* — Lisa Lea Edmonds
(74) *Attorney, Agent, or Firm* — Qudus Olaniran; Judy Yee; Micky Minhas

(57) ABSTRACT

The description relates to computing devices, such as mobile computing devices. One example can include a first portion, a second portion, and an adhesive. The example can also include micro heaters positioned proximate to the adhesive. The micro heaters are configured to be selectively energized to supply sufficient thermal energy to the adhesive to facilitate curing of the adhesive.

21 Claims, 8 Drawing Sheets

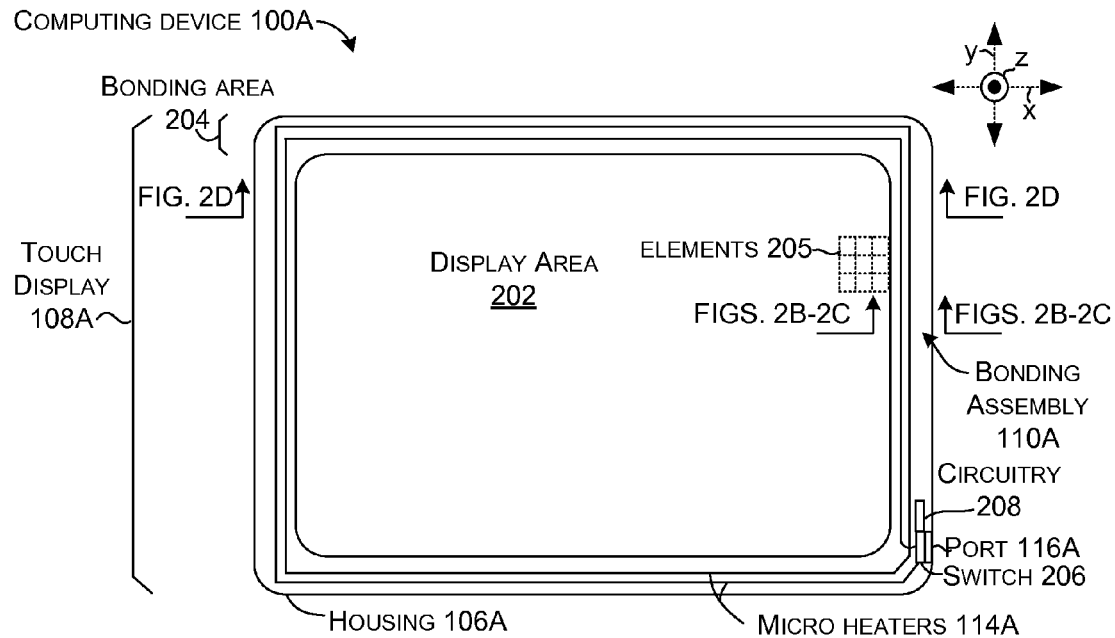
FIG. 2A
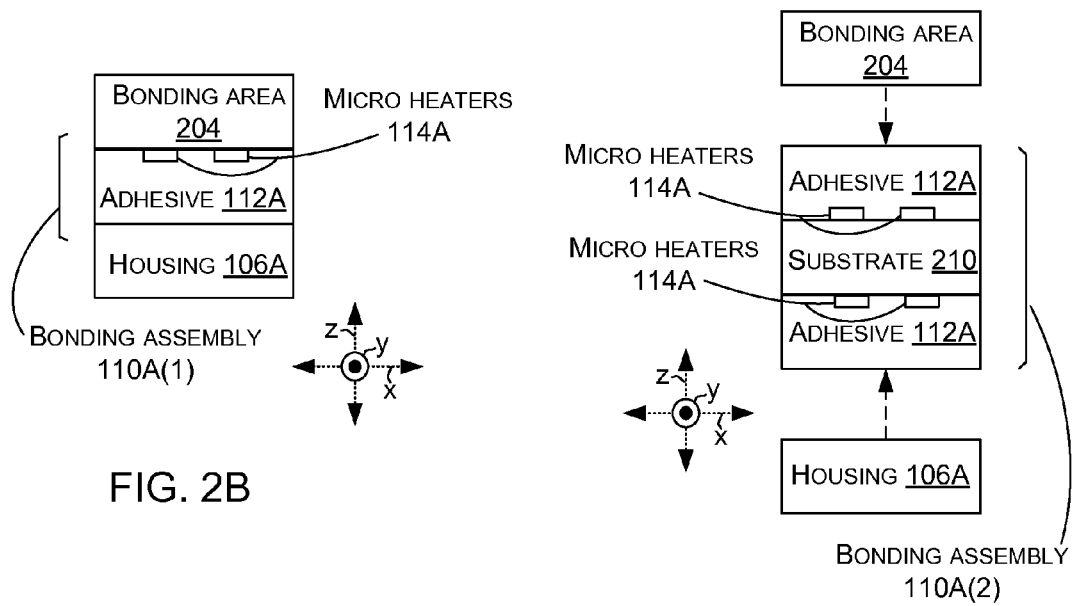
FIG. 2B
FIG. 2C

COMPUTING DEVICE BONDING ASSEMBLIES

BACKGROUND

The description relates to devices, such as computing devices, and to securing device elements together.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIG. 2A is a top view of an example computing device bonding assembly implementation in accordance with the present concepts.

FIGS. 2B-2D are sectional views of example bonding assemblies as indicated in FIG. 2A in accordance with the present concepts.

DESCRIPTION

The present concepts relate to computing devices and removably securing elements of computing devices together. Toward this end, the present concepts can employ bonding assemblies to removably secure the elements. The bonding assemblies can include an adhesive and micro heaters positioned proximate to the adhesive. The micro heaters can provide localized heating to the adhesive without heating other portions of the computing device to temperatures that can damage other elements. The micro heaters can be energized to heat the adhesive. Heating the adhesive can facilitate interfacing of the elements and the adhesive and transitioning the adhesive from a relatively pliant state to a relatively rigid bonding state. The energy can be disconnected from the micro heaters and the adhesive can bond the elements. If a subsequent need arises to separate the elements, the micro heaters can be re-energized to change the adhesive back to the relatively pliant state.

Figure 1A:
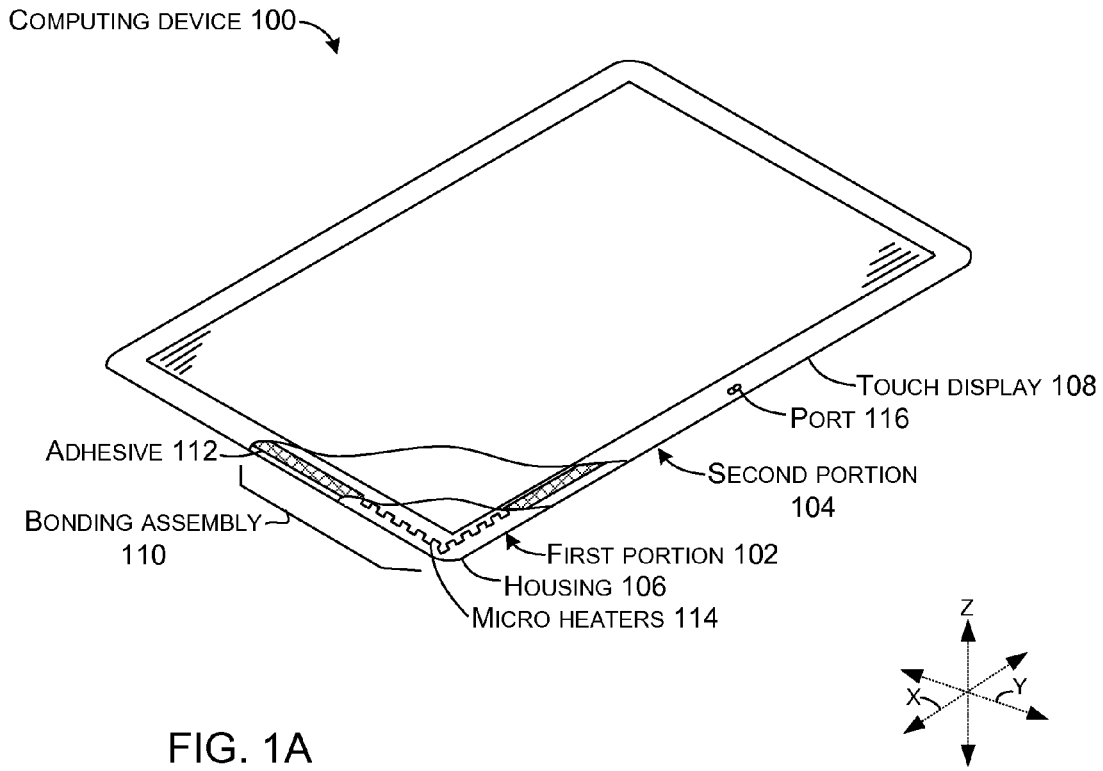
FIGS. 1A-1G are perspective views of example computing device bonding assembly implementations in accordance with the present concepts.

FIG. 1A shows a partial cut-away view of an example computing device 100 manifest as a tablet type computing device. The computing device 100 can include first and second portions 102 and 104. In this example, the first portion is manifest as a housing 106 and the second portion is manifest as a display screen, such as a touch display 108. The computing device can also include an adhesive assembly or bonding assembly 110. In this case, the bonding assembly includes an adhesive 112 and micro heaters 114 positioned proximate the adhesive. The computing device can also include a port 116 for energizing the micro heaters 114.

The elements of computing device 100 are discussed collectively in more detail relative to FIGS. 1B-1G.

Figure 1B:
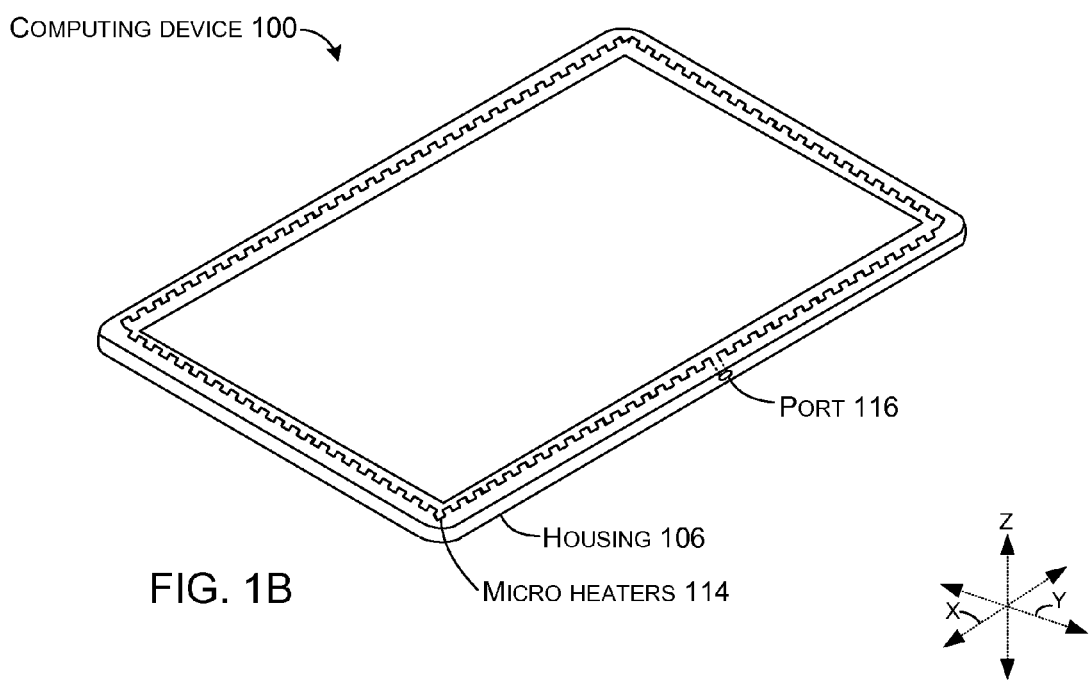

FIG. 1B shows the micro heaters 114 positioned on the housing 106 and electrically connected to port 116. Various types and configurations of micro heaters are contemplated. In some cases, the micro heaters can be formed of a conductor that when energized generates heat. The micro heaters can be formed utilizing various techniques. For instance, the micro heaters can be conductive wires that are positioned on the housing 106. In other implementations, the micro heaters can be conductive traces, such as metal traces that are patterned on the housing or 3D printed on the housing.

Figure 1C:
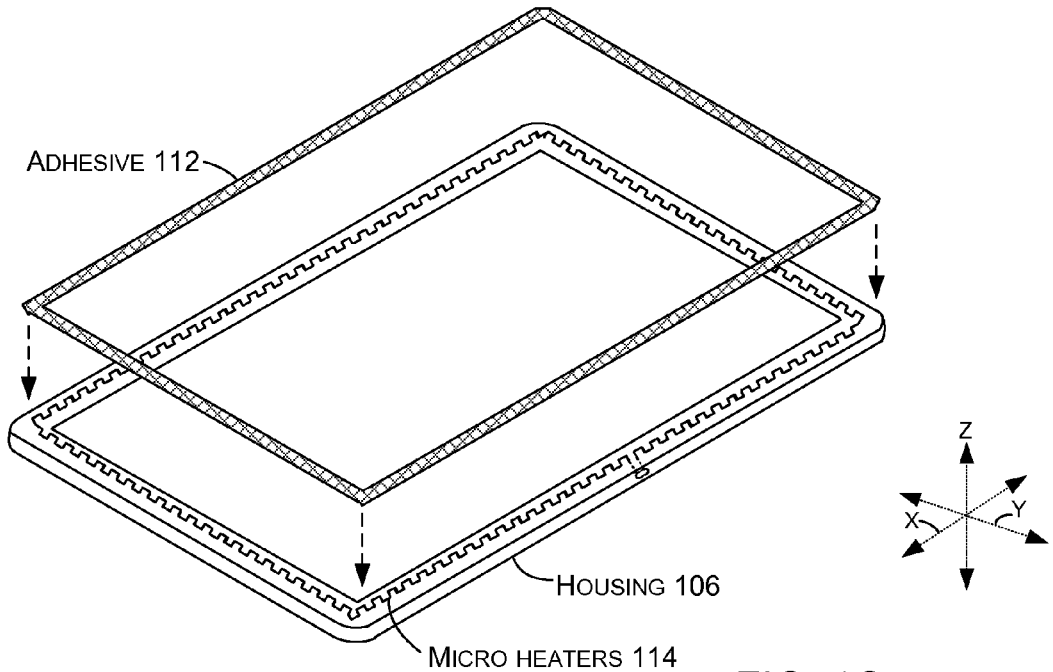
Figure 1D:
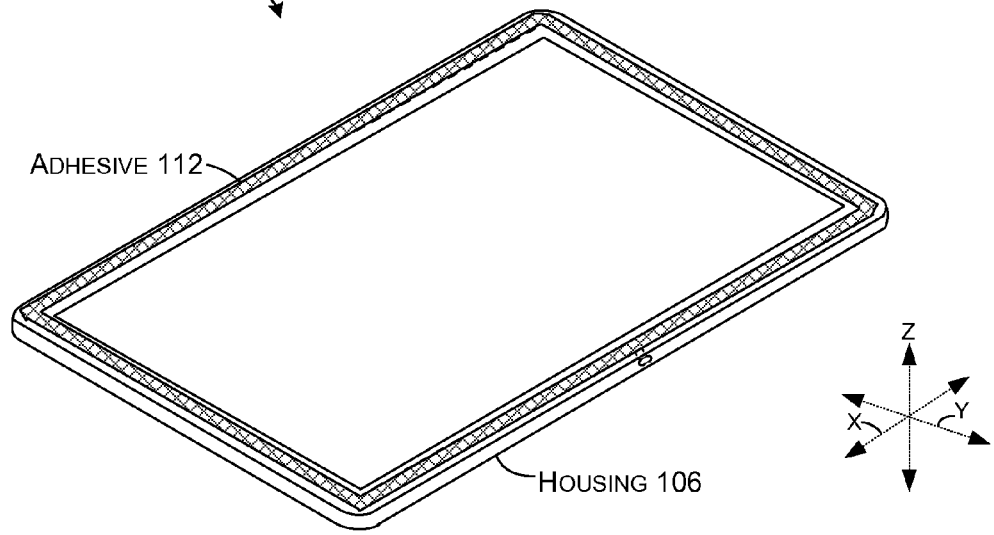

FIG. 1C shows the adhesive 112 positioned above the housing 106. FIG. 1D shows the adhesive 112 positioned on the housing 106 proximate to the micro heaters 114 (obstructed in FIG. 1D, see FIG. 1C).

The configuration of the micro heaters 114 can be customized to provide a desired amount of heating to the proximate adhesive 112. The micro heaters may be formed in a straight line. In FIG. 1C, the micro heaters form a serpentine pattern or zigzag pattern to increase heating per unit length in comparison to a straight line configuration. An alternative configuration that employs multiple wraps of the micro heaters is illustrated relative to FIGS. 2A-2D. The configuration of the micro heaters can be uniform around the device or variable depending upon location. For instance, the micro heaters may be manifest in a zigzag manner proximate to a heat sink to provide sufficient heating because the heat sink may dissipate heat from the micro heaters whereas a straight-line configuration may be used on other parts of the device to provide sufficient heating.

In the illustrated example of FIG. 1C, the amount of adhesive 112 is uniform around the device. However, in other configurations, more (e.g. wider and/or thicker) adhesive may be utilized in some regions than others. As such, the micro heaters may be zigzagged (or otherwise increased) in the regions with more adhesive and run in a linear fashion (e.g., less density per linear length of bonding surface) where there is less adhesive to heat. Stated another way, the localized configuration of the micro heaters can be customized for the volume (and/or other parameter) of the adhesive at that location.

Figure 1E:
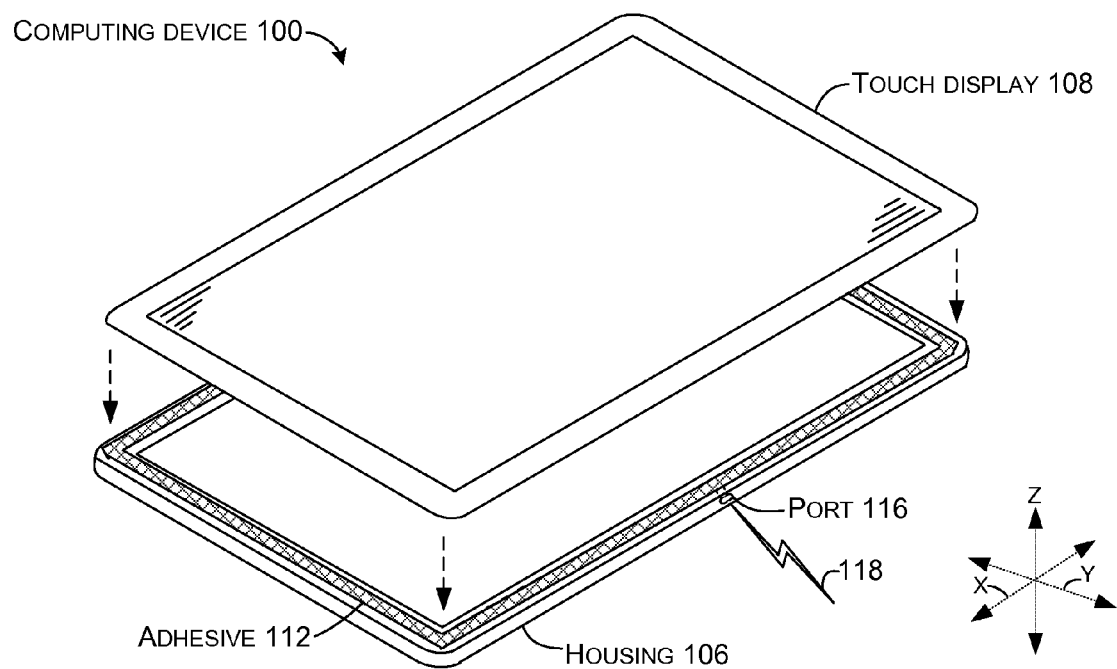

FIG. 1E shows the touch display 108 positioned over the housing 106. The touch display and the housing can be removeably bonded by energizing the micro heaters 114 (obscured, see FIG. 1C) via port 116 as indicated at 118. The micro heaters can heat adhesive 112 to facilitate curing the adhesive (e.g. to drive the adhesive to a state having desired properties). In the case of a temperature sensitive adhesive, heating the adhesive to a first temperature can cause the adhesive to be relatively pliant so that the adhesive makes effective contact with the housing 106 and the touch display 108. With some temperature sensitive adhesives, reaching a second temperature that is higher than the first temperature causes the adhesive to transform from the relatively pliant state to the relatively rigid state. For instance, in some implementations, the thermal set adhesive (TSA) or heat activated films (HAF) use temperature to initiate crosslinking of the adhesive material. This forms a bond with the substrates (e.g., the housing 106 and touch display 108). Examples include; Tesa 584XX and 84XX series adhesives, among others. Other scenarios are contemplated in which the micro heaters are driven to multiple different temperatures to affect an adhesive or other temperature-sensitive material in various ways.

With pressure sensitive adhesives, heating the adhesive 112 with the micro heaters 114 (obscured, see FIG. 1C) can decrease curing times and/or decrease pressure applied to the housing 106 against the touch display. For instance, the heat is useful for softening the material to improve wetting and/or to increase surface area. This can increase the bonding strength since the resulting adhesion can be a function of the surface area. The heat can also decrease the time that it takes the adhesive to reach full strength. Examples of pressure sensitive adhesives can include; 3M 86220B, Tesa 626XXX and 627XXX series, and Nitto Denko 575XXX series, among others. Thus, assembly time can be reduced and/or the likelihood of damaging components, such as the touch display 108, due to excessive pressure application can be decreased. This can be especially valuable as devices are configured in thinner form factors, where traditional pressures can cause damage to the components, such as broken display screens or bent enclosures. Thus, the present concepts enable manufacturers to effectively bond device portions with less or no pressure during the bonding process, thereby allowing components to be selected for their desired attributes (e.g., thinness, clarity, etc.) rather than the ability to withstand high pressures or global (versus localized) heat application during assembly.

Figure 1F:
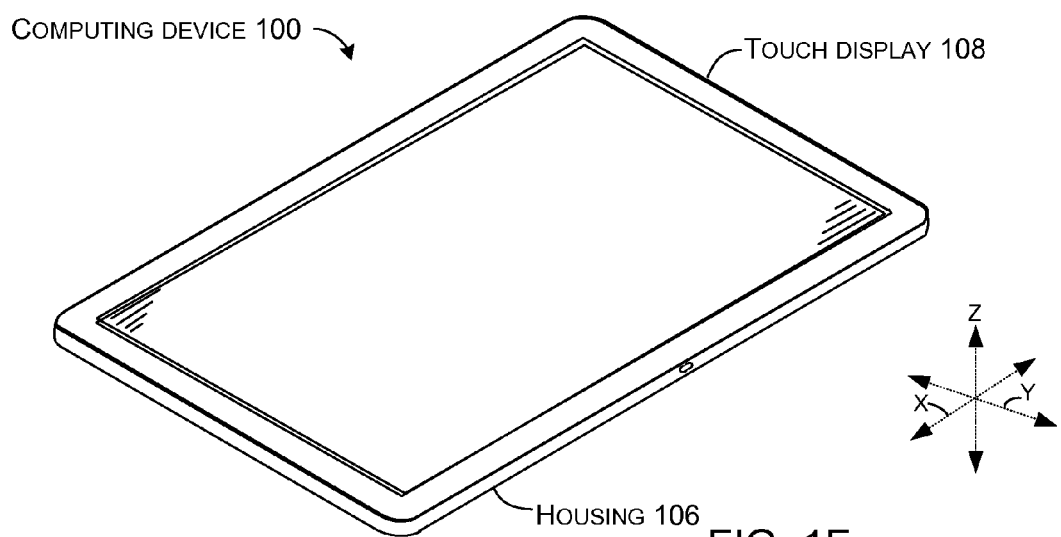
Figure 1G:
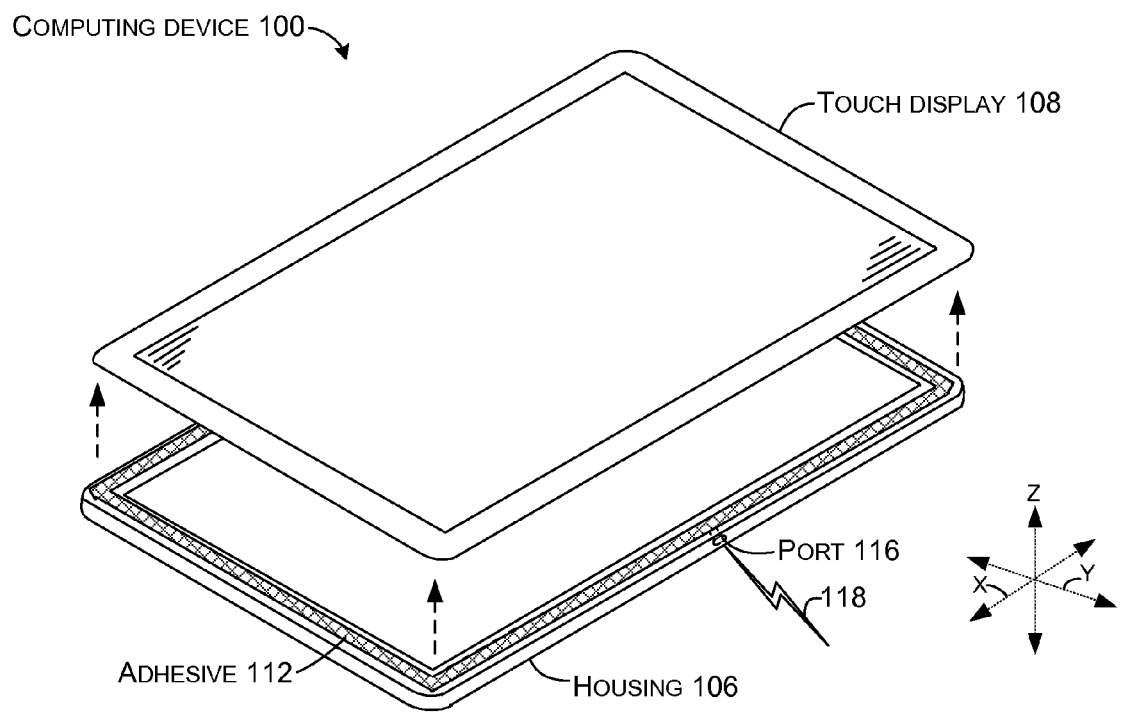

FIG. 1F shows the touch display 108 bonded to the housing 106. FIG. 1G shows that the micro heaters (obstructed, see FIG. 1C) can be subsequently energized (e.g., re-energized) at 118 to heat the adhesive 112 to a temperature where it has lower bonding properties and the touch display 108 can be separated from the housing 106. Stated another way, the micro heaters can be subsequently energized to heat the adhesive to a temperature point where it has less bonding properties and becomes more pliant and the touch display can be more readily separated from the housing.

Traditional techniques often utilize pressure sensitive adhesives to secure elements together. In such cases, the pressure sensitive adhesive is positioned between the two elements and the elements are pressed together with relatively high forces until the adhesive cures. This technique presents several shortcomings. First, the pressure utilized to cause the pressure sensitive adhesive to cure can damage the elements. Second, the cure time tends to be relatively long, such as multiple hours. Maintaining pressure on the elements for this long greatly diminishes assembly line production. Third, once secured the elements are not readily separated, such as for servicing the device, and breakage can occur when trying to separate the elements. In contrast, the present implementations can energize the micro heaters to affect the state of the adhesive. As such, little or no pressure is required during the bonding process. Further, where the adhesive is a pressure sensitive adhesive, the heating of the adhesive by the micro heaters can cause the adhesive to cure to a bonding state very quickly (e.g., in seconds or minutes rather than hours) so that the device can proceed to the next stage of assembly. Further, the micro heaters can be re-energized to return the adhesive to a pliant state so that the device can be serviced. For example, if the device fails initial quality control inspections it can be separated and examined. Similarly, if the device subsequently breaks and needs servicing it can be separated for servicing without risk of damage.

Figure 2D:
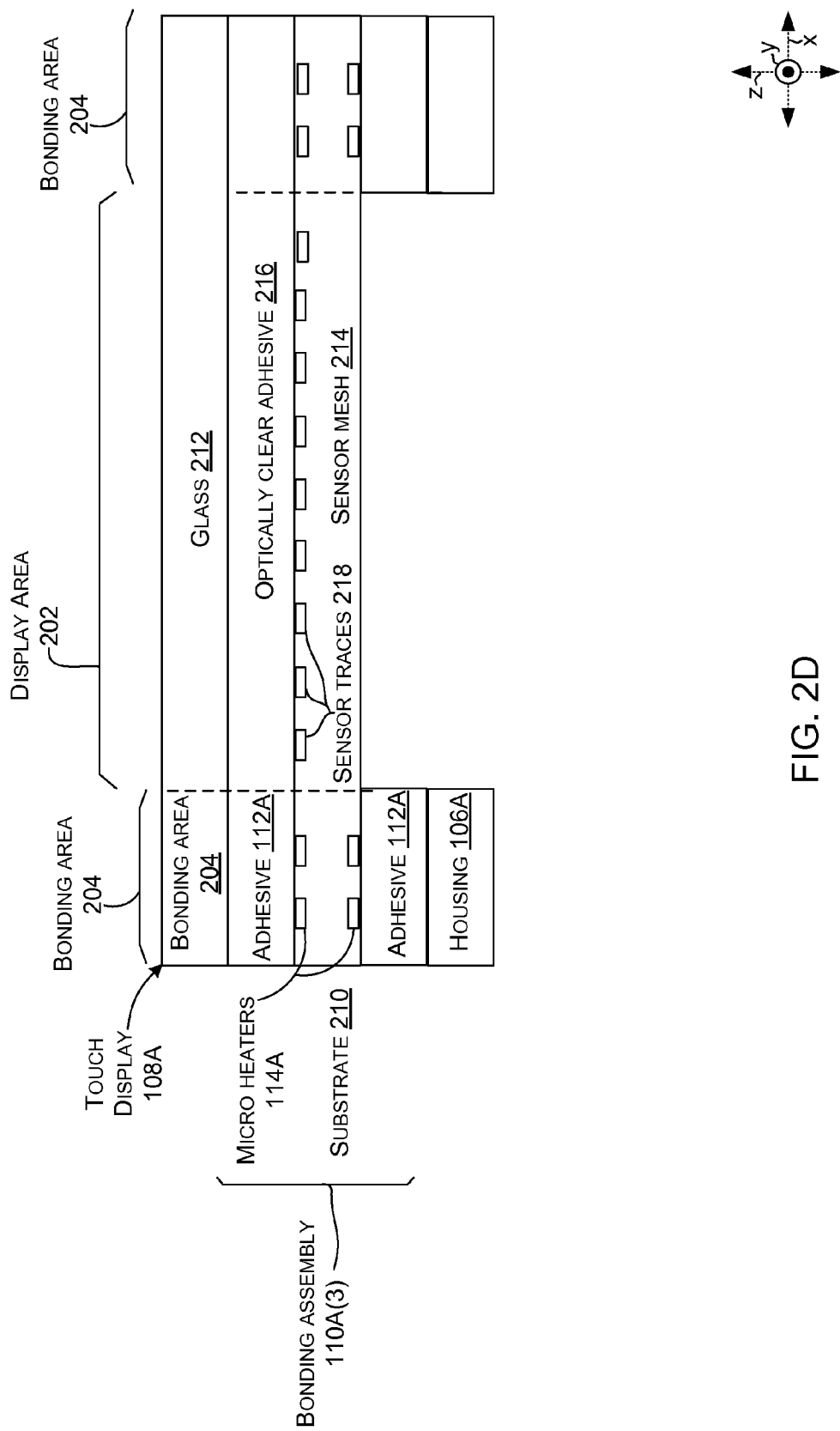

FIGS. 2A-2D collectively show another computing device 100A. (The suffix "A" is intended to indicate that the element is similar to like elements introduced above relative to FIGS. 1A-1G). FIG. 2A shows a top view of computing device 100A. FIGS. 2B-2D are partial sectional views as indicated in FIG. 2A.

For purposes of explanation, the touch display 108A can be thought of as having a display area 202 and a bonding area 204. Note also, that while not normally visible, the display area also contains imaging elements and touch sensitive elements, some of which are shown in ghost at 205. The bonding area 204 tends to be around the periphery of the touch display with the display area in the center. The bonding area may include various elements that can serve to electrically couple touch sensors of the display area to electronic components (not shown) of the computing device, such as processor, graphics card, etc. Bonding assembly 110A can include micro heaters 114A and adhesive 112A (visible in FIGS. 2B-2D). The bonding assembly 110A can serve to selectively secure the touch display 108A and the housing 106A to one another. In this case, the micro heaters are manifest as multiple conductive traces around a periphery of the computing device 100A (e.g., around a periphery of the device). In this case, the number of traces can be selected to provide adequate energy to raise the temperature of the adhesive to a desired level (e.g. temperature).

Further, note that in this implementation, the micro heaters 114A can provide multiple functionalities relative to the computing device (e.g., at least one other functionality beyond heating the adhesive). In this configuration, a switch 206 can enable the multifunctionality. For instance, during assembly and/or disassembly of the computing device, the switch 206 can electrically connect the micro heaters to port 116A. The micro heaters 114A can then be energized through the port 116A to heat the adhesive 112A. At other times, the switch 206 can be used to disconnect the micro heaters 114A from the port 116A and electrically connect the micro heaters to other electrical circuitry/components 208.

In one example, the other electrical circuitry/components 208 can entail the computing device's ground (not shown). The micro heaters 114A can be connected to the computing device's ground so that the micro heaters can dissipate electrical charge and reduce the chance of a charge build up that could produce a damaging electrostatic discharge event. In another example, the micro heaters can function as an antenna for the computing device. In such a configuration, the precise nature of the micro heaters can contribute to the secondary functionality. For instance, when the micro heaters are formed as conductive traces, the precision with which the micro heater can be formed and the precision of their location on the device can contribute to proper secondary functionality. These examples are just a few of the secondary functionality that can be achieved by the micro heaters 114A in addition to their primary functionality (e.g. heating the adhesive 112A).

FIG. 2B shows a first variation of the bonding assembly 110A(1) and FIG. 2C shows a second variation of the bonding assembly 110A(2). FIG. 2D shows a third variation of the bonding assembly 110A(3).

In FIG. 2B, the micro heaters 114A can be manifest as conductive traces that are formed on the underside of the touch display's bonding area 204, such as on a touch sensor film. Thus, the bonding assembly 110A(1) is manifest as the adhesive 112A and the micro heaters 114A securing the housing 106A to the touch display 108A (FIG. 2A). (This configuration can be contrasted with the configuration of FIGS. 1A-1G where the micro heaters are positioned on the housing). In this manifestation, it should be noted that the conductive traces can be formed simultaneously as part of the touch sensor pattern (e.g., photo patterned) on either one side or both sides of the touch sensor film. This can be also part of the display circuitry (e.g. in case of foldable OLED displays where the conductive/resistive traces can be part of photo deposition of thin-film transistor (TFT) layer on the touch display's flexible glass or Polyimide).

In FIG. 2C, the bonding assembly 110A(2) can be preformed as a separate component that can be positioned between the housing 106A and the bonding area 204 of the touch display 108A (FIG. 2A). In this example, the bonding assembly 110A(2) can include a substrate 210. The substrate 210 can have the micro heaters 114A positioned on one of both sides thereof. Adhesive 112A can be positioned on both sides of the substrate to complete the bonding assembly 110A(2). The bonding assembly can then be positioned between the housing 106A and the touch display's bonding area 204.

In some configurations, the substrate 210 can be manifest as a carrier tape. In such a configuration, the micro heaters 114A can be formed on the carrier tape. In one case, the micro heaters can be conductive wires adhered to the carrier tape. In another case, the micro heaters can be conductive traces, such as conductive particles (in some cases nanoparticles) that are positioned on the carrier tape via 3D printing.

In other configurations, the substrate 210 can be manifest as an insulating polymer film with the micro heaters 114A and the adhesive 112A positioned upon the polymer film to form a flexible printed circuit. In such a case, the micro heaters can be formed with any semiconductor processing technique such as deposition and patterning and/or by 3D printing. Note that the flexible nature of these implementations facilitates the use of micro heaters on planar devices as well as bent, bendable, molded, and/or flexible devices. For instance, in the case of a flexible OLED (either glass or plastic) implementation, the micro heaters as well as other conductive traces can be photo patterned during OLED TFT structure deposition. Further micro heaters may be used in components in wearable devices, such as flexible wrist-worn devices. The micro heaters may be used to facilitate bonding of display components or other components in wearable devices.

This implementation of bonding assembly 110A(2) can allow the bonding assemblies to be formed in advance (e.g., in a separate process) and then readily integrated with the housing 106A and the bonding area 204 of the touch display 108A (FIG. 2A) during assembly of the computing device 100A.

With both implementations (FIGS. 2B and 2C) the micro heaters can be selectively energized during assembly to heat the adhesive and facilitate bonding of the housing 106A and the touch display 108A (FIG. 2A). In the event that the need arises to separate the housing and the touch display, the micro heaters can be selectively re-energized to heat the adhesive to facilitate separation of the housing and the touch display. As mentioned above, in the interim the micro heaters can perform an alternative functionality for the computing device 100A.

Note further that the heat provided by the micro heaters 114A is localized proximate to the adhesive 112A. As such, the temperature of the adhesive can be raised substantially without heating other elements to a damaging temperature. For instance, the micro heaters 114A can heat the adhesive to a relatively high temperature without damaging nearby structures, such as the imaging elements and touch sensitive elements 205 (FIG. 2A). Other heating techniques, such as heating the device with hot air could damage the nearby structures before the adhesive was raised to a desired temperature.

FIG. 2D shows another bonding assembly 110A(3) implementation. In this case, the touch display 108A can include a glass element 212, a sensor mesh 214, and an optically clear adhesive 216. Sensors traces 218, such as copper and/or silver conductive traces or graphene or some other organic compound, can be formed on the sensor mesh in the display area 202 to conduct electrical signals between the touch display and other electronic components (not shown) of the computing device. The bonding assembly's micro heaters 114A can be formed on the sensor mesh in the bonding area 204 using a similar process. Thus, this implementation can create the micro heaters 114A on an existing element (e.g., the sensor mesh 214) at the same time and with the same process that is utilized to form the sensor traces 218. Thus, these implementations can provide a superior bonding process with few additional components and little or no additional costs.

Figure 3:
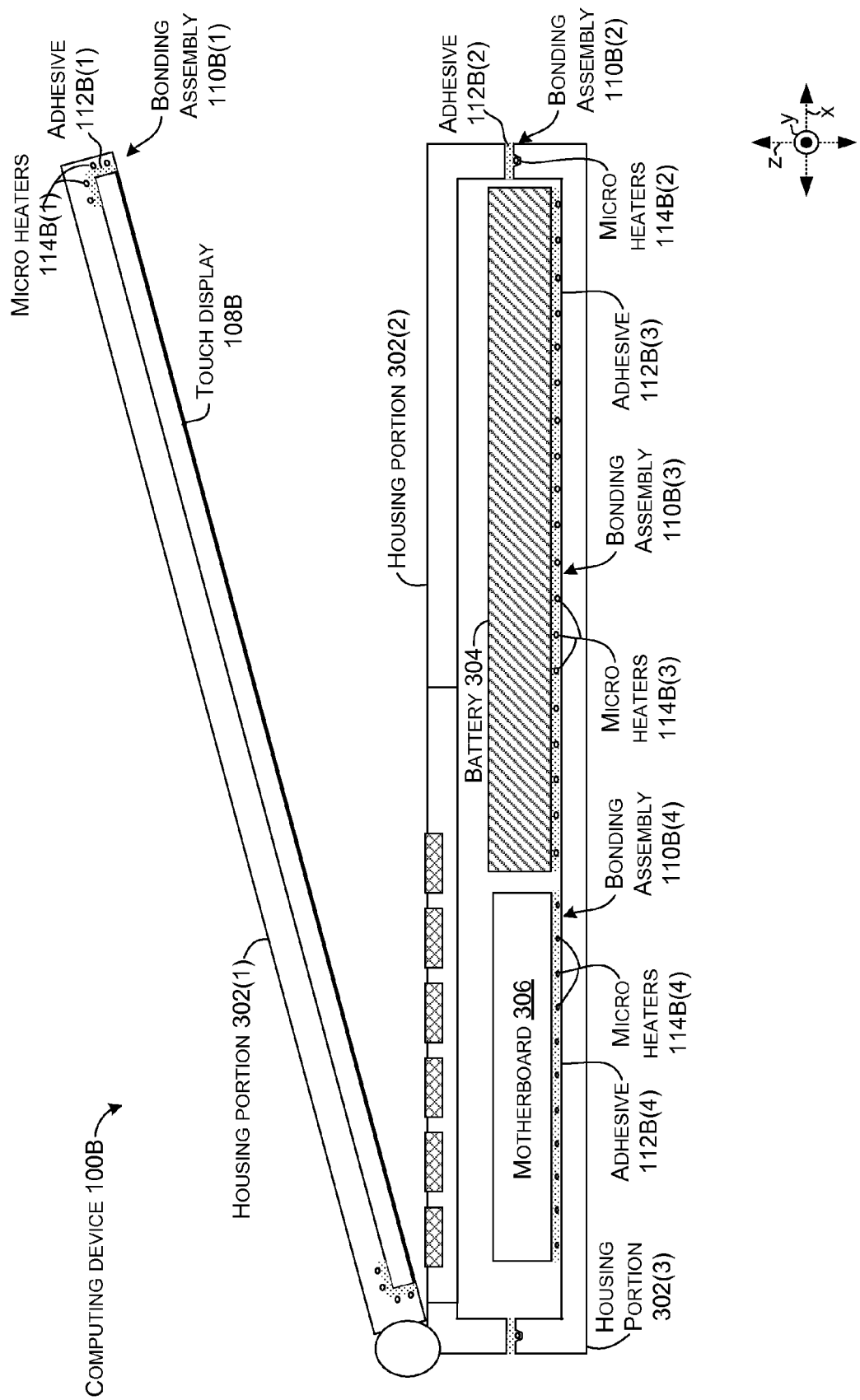
FIGS. 3 and 4 are sectional views of example computing device bonding assembly implementations in accordance with the present concepts.

FIG. 3 shows another computing device 100B, manifest as a notebook type computer. Computing device 100B offers four different examples of how the present bonding assembly concepts can be employed. This computing device has three housing portions 302(1), 302(2), and 302(3), touch display 108B, a battery 304, and/or other electronic components in the form of a motherboard 306. A first bonding assembly 110B(1) can secure the touch display 108B to housing portion 302(1). Second bonding assembly 110B(2) can secure housing portions 302(2) and 302(3). Third bonding assembly 110B(3) can secure battery 304 to housing portion 302(3). Fourth bonding assembly 110B(4) can secure motherboard 306 to housing portion 302(3).

Bonding assembly 110B(1) can include micro heaters 114B(1) positioned proximate to adhesive 112B(1) near the end and underside of touch display 108B between the screen and housing portion 302(1).

Bonding assembly 110B(2) can include micro heaters 114B(2) positioned proximate to adhesive 112B(2) between housing portions 302(2) and 302(3).

Bonding assembly 110B(3) can include micro heaters 114B(3) positioned proximate to adhesive 112B(3) between housing portion 302(3) and battery 304.

Bonding assembly 110B(4) can include micro heaters 114B(4) positioned proximate to adhesive 112B(4) between housing portion 302(3) and motherboard 306.

Figure 4:
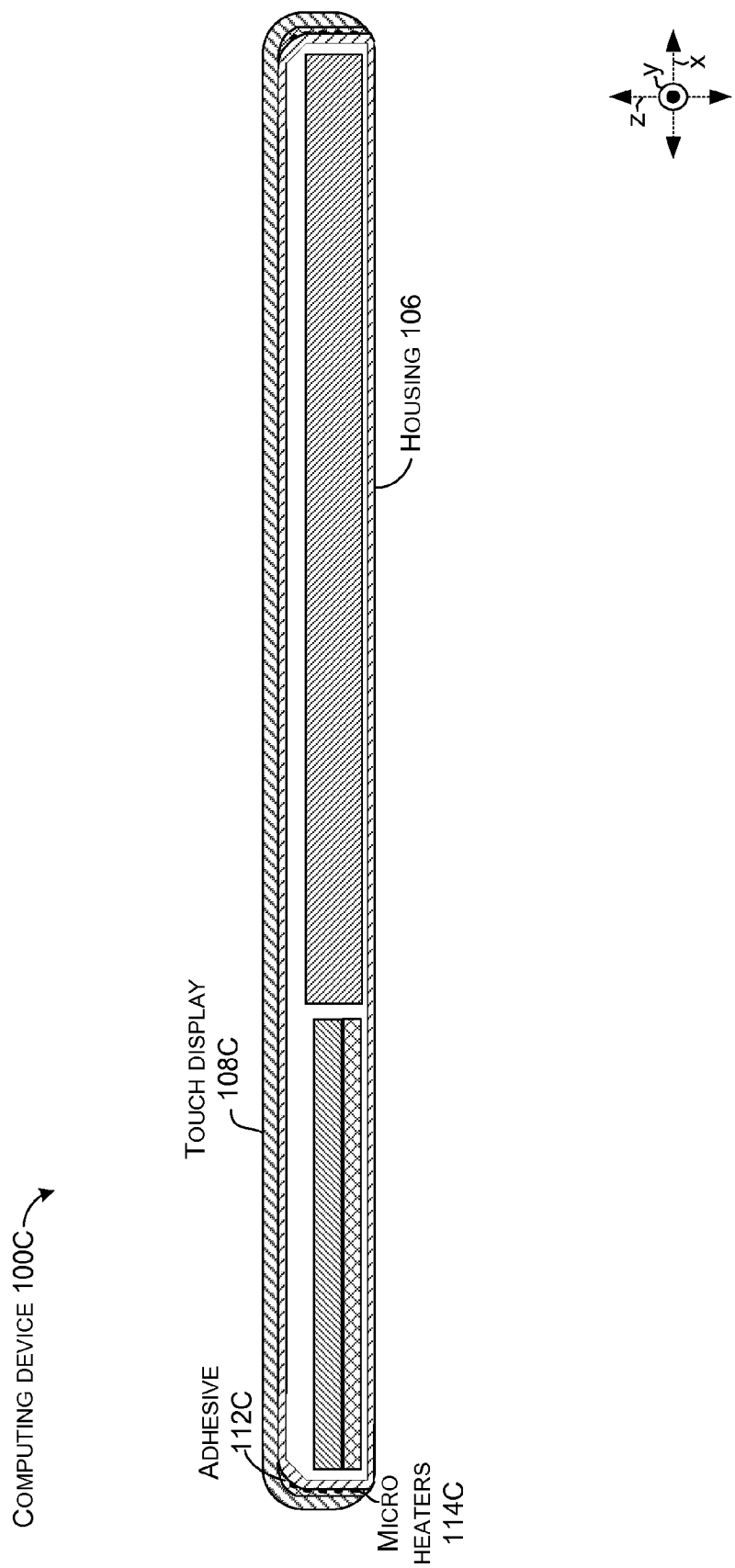

FIG. 4 shows the present bonding assembly concepts applied to a curved touch display 108C. In this case, the micro heaters 114C and adhesive 112C are positioned at the edges of the touch display (e.g., on the ends of the housing where the touch display is bent from generally horizontal to generally vertical). The present implementations lend themselves to use with bent and/or flexible devices. For instance, the flexible circuit bonding assembly 110A(2) of FIG. 2C can be utilized to bond flexible displays, such as flexible organic light emitting diode (OLED) displays to a housing (rigid or flexible) and/or electronic components.

The micro heater concepts described in FIGS. 3 and 4 may be operated automatically, for example, in the context of manufacturing. For instance, the operation of micro heaters 114B(1)-(4) may be controlled by a microcontroller, computer, or other device along an assembly so that the micro heaters are activated at the proper times during manufacturing to activate adhesives or other chemical compounds. Intelligently activating various adhesives in a particular order may advantageously provide for an efficient, cost-effective assembly. For example, micro heaters 114B(3) that is used to secure battery 304 may be activated only after computing device 100B passes a final end-of-line test. Alternatively, none of micro heaters 114B(1)-(4) may be activated until after computing device 100B passes a final end-of-line test.

The present bonding concepts can be utilized with various types of computing devices, such as notebook computers, foldable tablet type computers, bent and bendable devices, smart phones, wearable smart devices, gaming devices, entertainment consoles, rigid devices, flexible devices, home and enterprise appliances and/or other developing or yet to be developed types of computing devices. As used herein, a computing device can be any type of device that has some amount of processing and/or storage capacity. A mobile computing device can be any computing device that is intended to be readily transported by a user.

Additional Examples

Various device examples are described above. Additional examples are described below. On example is manifest as a device that includes a first portion and a second portion and a temperature sensitive adhesive. The example can also include micro heaters positioned proximate to the temperature sensitive adhesive. The micro heaters are configured to be selectively energized to supply sufficient thermal energy to the temperature sensitive adhesive to produce a relatively pliant state of the temperature sensitive adhesive where the first and second portions can be positioned proximate to one another. When the micro heaters are no longer energized, the temperature sensitive adhesive transitions to a second less pliant bonding state to secure the first portion and the second portion. The micro heaters are configured to be subsequently re-energized to return the temperature sensitive adhesive to the relatively pliant state so that the first portion can be separated from the second portion.

Any combination of the above and/or below examples where the first portion comprises a housing portion and the second portion comprises another housing portion.

Any combination of the above and/or below examples where the first portion comprises a housing and the second portion comprises a display screen.

Any combination of the above and/or below examples where the temperature sensitive adhesive is positioned on the first portion and/or on the second portion.

Any combination of the above and/or below examples further including a flexible printed circuit that includes the temperature sensitive adhesive and the micro heaters.

Any combination of the above and/or below examples where the micro heaters comprise conductive wire comprising silver/silver compounds, silver nano-wire, copper/copper compounds, and/or carbon nano tubes.

Any combination of the above and/or below examples where the conductive wire is oriented in a pattern to increase a length of the conductive wire proximate to the temperature sensitive adhesive.

Any combination of the above and/or below examples where the pattern comprises a zigzag pattern or a serpentine pattern.

Any combination of the above and/or below examples where multiple wraps of the conductive wire are oriented proximate to the temperature sensitive adhesive.

Any combination of the above and/or below examples where the micro heaters comprise metal traces.

Any combination of the above and/or below examples where the metal traces comprise conductive particles.

Any combination of the above and/or below examples where the conductive particles comprise nanoparticles.

Any combination of the above and/or below examples where the conductive particles are patterned on a carrier tape.

Any combination of the above and/or below examples where the conductive particles are 3D printed on the carrier tape.

Any combination of the above and/or below examples where the temperature sensitive adhesive comprises a single layer or multiple layers.

Any combination of the above and/or below examples when the micro heaters are not energized, the micro heaters are configured to provide another functionality.

Any combination of the above and/or below examples where the another functionality comprises an antenna functionality.

Any combination of the above and/or below examples further comprising a switch having a first position that is configured to allow the micro heaters to be energized and a second position that is configured to connect the micro heaters to electronic components to achieve another functionality.

A further example device that includes a housing and a display screen. The example also includes an adhesive assembly removably bonding the housing to the display screen. The adhesive assembly manifest as a temperature sensitive adhesive and micro heaters positioned proximate to the temperature sensitive adhesive.

An additional example device that includes a first portion and a second portion, an adhesive, and micro heaters positioned proximate to the adhesive. The micro heaters are configured to be selectively energized to supply sufficient thermal energy to the adhesive to facilitate curing of the adhesive.

CONCLUSION

Although techniques, methods, devices, systems, etc., pertaining to selectively removable bonding of computing devices are described in language specific to structural features and/or methodological acts, it is to be understood that the subject matter defined in the appended claims is not necessarily limited to the specific features or acts described. Rather, the specific features and acts are disclosed as exemplary forms of implementing the claimed methods, devices, systems, etc.

The invention claimed is:
1. A device, comprising:
a first portion and a second portion;
a temperature sensitive adhesive; and, micro heaters positioned proximate to the temperature sensitive adhesive, wherein:
the micro heaters are configured to be energized to supply sufficient thermal energy to the temperature sensitive adhesive to produce a relatively pliant state of the temperature sensitive adhesive where the first and second portions can be positioned proximate to one another,
when the micro heaters are no longer energized, the micro heaters are configured to provide another functionality and the temperature sensitive adhesive transitions to a second less pliant bonding state to secure the first portion and the second portion, and
the micro heaters are configured to be subsequently re-energized to return the temperature sensitive adhesive to the relatively pliant state so that the first portion can be separated from the second portion.

2. The device of claim 1, wherein the first portion comprises a housing portion and the second portion comprises another housing portion.

3. The device of claim 1, wherein the first portion comprises a housing and the second portion comprises a display screen.

4. The device of claim 1, wherein the temperature sensitive adhesive is positioned on the first portion and/or on the second portion.

5. The device of claim 1, further comprising a flexible printed circuit that includes the temperature sensitive adhesive and the micro heaters.

6. The device of claim 1, wherein the micro heaters comprise conductive wire comprising silver/silver compounds, silver nano-wire, copper/copper compounds, and/or carbon nano tubes.

7. The device of claim 6, wherein the conductive wire is oriented in a pattern to increase a length of the conductive wire proximate to the temperature sensitive adhesive.

8. The device of claim 7, wherein the pattern comprises a zigzag pattern or a serpentine pattern.

9. The device of claim 6, wherein multiple wraps of the conductive wire are oriented proximate to the temperature sensitive adhesive.

10. The device of claim 1, wherein the micro heaters comprise metal traces.

11. The device of claim 10, wherein the metal traces comprise conductive particles.

12. The device of claim 11, wherein the conductive particles comprise nanoparticles.

13. The device of claim 11, wherein the conductive particles are patterned on a carrier tape.

14. The device of claim 13, wherein the conductive particles are 3D printed on the carrier tape.

15. The device of claim 13, wherein the temperature sensitive adhesive comprises a single layer or multiple layers.

16. The device of claim 1, wherein the micro heaters are connected to a ground of the device.

17. The device of claim 1, wherein the another functionality comprises an antenna functionality.

18. The device of claim 1, further comprising a switch having a first position that is configured to allow the micro heaters to be energized and a second position that is configured to connect the micro heaters to electronic components to achieve the another functionality.

19. A mobile computing device, comprising:
a housing;
a display screen;
an adhesive assembly removably bonding the housing to the display screen, the adhesive assembly comprising:
  temperature sensitive adhesive; and,
  micro heaters positioned proximate to the temperature sensitive adhesive; and
a port configured to receive electrical energy and conduct the electrical energy to at least one of the micro heaters.

20. A computing device, comprising:
a first portion and a second portion;
an adhesive;
micro heaters positioned proximate to the adhesive, wherein the micro heaters are configured to be energized to supply sufficient thermal energy to the adhesive to facilitate curing of the adhesive; and
a switch configured to electrically connect the micro heaters to a source of electrical energy.

21. A computing device, comprising:
a first portion and a second portion; and
a flexible printed circuit that includes a temperature sensitive adhesive and micro heaters positioned proximate to the temperature sensitive adhesive, wherein:
the micro heaters are configured to be energized to supply sufficient thermal energy to the temperature sensitive adhesive to produce a relatively pliant state of the temperature sensitive adhesive where the first and second portions can be positioned proximate to one another,
when the micro heaters are no longer energized, and the temperature sensitive adhesive transitions to a second less pliant bonding state to secure the first portion and the second portion, and
the micro heaters are configured to be subsequently re-energized to return the temperature sensitive adhesive to the relatively pliant state so that the first portion can be separated from the second portion.

* * * * *